(12) United States Patent
Chen et al.

(10) Patent No.: US 8,765,504 B2
(45) Date of Patent: Jul. 1, 2014

(54) SEMICONDUCTOR DEVICE STRUCTURES AND THE SEPARATING METHODS THEREOF

(75) Inventors: Shih-I Chen, Hsinchu (TW); Ching-Pei Lin, Hsinchu (TW); Tzu-Chieh Hsu, Hsinchu (TW); Chia-Liang Hsu, Hsinchu (TW)

(73) Assignee: EPISTAR Corporation, Hsinchu (TW)

( * ) Notice: Subject to any disclaimer, the term of this patent is extended or adjusted under 35 U.S.C. 154(b) by 0 days.

(21) Appl. No.: 13/490,992

(22) Filed: Jun. 7, 2012

(65) Prior Publication Data

US 2012/0313249 A1 Dec. 13, 2012

(30) Foreign Application Priority Data

Jun. 9, 2011 (TW) .............................. 100120295 A

(51) Int. Cl.
*H01L 21/00* (2006.01)
*H01L 29/18* (2006.01)
*H01L 33/00* (2010.01)
*H01L 29/205* (2006.01)

(52) U.S. Cl.
USPC .................................. 438/33; 257/88; 257/91

(58) Field of Classification Search
USPC .................................... 438/33, 42; 257/88, 91
See application file for complete search history.

(56) References Cited

U.S. PATENT DOCUMENTS

| | | | | |
|---|---|---|---|---|
| 3,693,302 A | * | 9/1972 | Hakes | 451/31 |
| 3,965,567 A | * | 6/1976 | Beerwerth et al. | 438/13 |
| 6,835,960 B2 | * | 12/2004 | Lin et al. | 257/81 |
| 2002/0030194 A1 | * | 3/2002 | Camras et al. | 257/98 |
| 2003/0136968 A1 | * | 7/2003 | Fjelstad | 257/82 |
| 2003/0189212 A1 | * | 10/2003 | Yoo | 257/79 |
| 2003/0218172 A1 | * | 11/2003 | Sugawara et al. | 257/72 |
| 2004/0173808 A1 | * | 9/2004 | Wu | 257/99 |
| 2005/0017262 A1 | * | 1/2005 | Shei et al. | 257/103 |
| 2005/0040424 A1 | * | 2/2005 | Erchak et al. | 257/100 |
| 2005/0079687 A1 | * | 4/2005 | Yoon et al. | 438/462 |
| 2005/0123676 A1 | * | 6/2005 | Kuwahara et al. | 427/66 |
| 2005/0136668 A1 | * | 6/2005 | Yotsuya | 438/689 |
| 2005/0151226 A1 | * | 7/2005 | Takeuchi et al. | 257/612 |
| 2005/0218806 A1 | * | 10/2005 | Sawa et al. | 313/582 |
| 2005/0242365 A1 | * | 11/2005 | Yoo | 257/103 |
| 2005/0258441 A1 | * | 11/2005 | Shitagami | 257/88 |
| 2006/0017061 A1 | * | 1/2006 | Sakamoto et al. | 257/103 |
| 2010/0072487 A1 | * | 3/2010 | Tsai et al. | 257/86 |

* cited by examiner

*Primary Examiner* — Karen Kusumakar
(74) *Attorney, Agent, or Firm* — Muncy, Geissler, Olds & Lowe, P.C.

(57) ABSTRACT

A method of separating semiconductor device structures comprises steps of providing a substrate having a first surface and a second surface opposite to the first surface; forming a plurality of semiconductor epitaxial stacks on the first surface; forming a patterned resist layer covering the semiconductor epitaxial stacks and exposing part of the first surface, or covering the second surface corresponding to the semiconductor epitaxial stacks; performing a physical etching process to directly server the substrate apart from an area of the first surface or the second surface not covered by the patterned resist layer; and separating the semiconductor epitaxial stacks to form a plurality of semiconductor device structures.

14 Claims, 12 Drawing Sheets

FIG. 3G                    FIG. 3H

SEMICONDUCTOR DEVICE STRUCTURES AND THE SEPARATING METHODS THEREOF

TECHNICAL FIELD

The disclosure relates to the semiconductor device structures and the separating methods thereof, especially relates to the semiconductor device structures with high light extraction efficiency and the separating methods thereof.

REFERENCE TO RELATED APPLICATION

This application claims the right of priority based on TW application Serial No. 100120295, filed on Jun. 9, 2011, and the content of which is hereby incorporated by reference in its entirety.

DESCRIPTION OF BACKGROUND ART

As the technology improves day by day, the semiconductor optoelectronic device makes large contribution in data transmission and in energy conversion. Take the systematic application as an example, the semiconductor optoelectronic device can be applied to the optical-fiber communication, the optics storage, and the military affairs. Classified by the way of conversion of the energy, the semiconductor optoelectronic device can be separated into three types: converting the electrical power into the light emission, such as the light-emitting diode and the laser diode; converting the light signal into the electrical power, such as the light detector; converting the light radiation energy into the electrical power, such as the solar cell.

For the semiconductor optoelectronic devices, the growth substrate plays a very important role. The essential semiconductor epitaxial structures which are used to form the semiconductor optoelectronic device are formed on the growth substrate. Therefore, how to choose a suitable growth substrate often becomes an important issue which could determine the quality of the semiconductor optoelectronic device.

However, sometimes a substrate suitable for device growth thereon is not a suitable substrate for device operation. Take the light emitting diode device for example, in the conventional red light emitting diode device manufacturing process, in order to improve the device growth quality, the opaque GaAs substrate which has the lattice constant close to that of the semiconductor epitaxial structure is often chosen to be the growth substrate. However, for the light emitting diode device which is operated to emit light, the opaque growth substrate degrades the light emitting efficiency during operation.

In order to satisfy the different requirements for the growth substrate and the operating substrate of the semiconductor optoelectronic device, the substrate transferring technology is developed. In other words, the semiconductor epitaxial structure grows from the growth substrate first, and the semiconductor epitaxial structure is transferred to the operating substrate for device operation later. Then, cutting and separating the semiconductor epitaxial structure to form the individual semiconductor optoelectronic devices after adhering the semiconductor epitaxial structure to the operating substrate.

The conventional method of cutting the growth substrate and separating the semiconductor epitaxial structure proceeds mainly by laser cutting. However, while cutting the growth substrate and separating the semiconductor epitaxial structure by laser, the opaque side product is formed because of the chemical reaction between the laser beam and the substrate and/or between the laser beam and the semiconductor epitaxial structure. The side product causes the degradation of the illumination efficiency of the semiconductor optoelectronic devices. If we remove the side products by the etchant, the surfaces of the semiconductor epitaxial structure can be destroyed simultaneously, and the yield of the structure goes down accordingly. Presently, how to cut the substrate and separate the semiconductor epitaxial structure effectively is one of the important research directions.

SUMMARY OF THE DISCLOSURE

In accordance with the description above, the present disclosure provides a semiconductor device structure and the separating method thereof, especially relates to a semiconductor device structure with high light extraction efficiency and the separating method thereof.

A method of separating semiconductor device structures in accordance with one embodiment of the disclosure is disclosed, which includes providing a substrate comprising a first surface and a second surface opposite to the first surface; forming a plurality of semiconductor epitaxial stacks on the first surface; forming a patterned resist layer and exposing part of the first surface, or covering the second surface corresponding to the semiconductor epitaxial stacks; performing a physical etching process to directly server the substrate apart from an area of the first surface or the second surface not covered by the patterned resist layer; and separating the semiconductor epitaxial stacks to form a plurality of semiconductor device structures.

A semiconductor device structure in accordance with one embodiment of the disclosure is disclosed, which includes a substrate comprising a first surface and a plurality of sidewalls adjacent to the first surface; a semiconductor epitaxial stack layer formed on the first surface, comprising a first semiconductor material layer with a first electrical conductivity, a second semiconductor material layer with a second electrical conductivity, and an active layer positioned between the first semiconductor material layer and the second semiconductor material layer; wherein all of the sidewalls are roughened by microblasting.

A package type semiconductor device structure in accordance with another embodiment of the disclosure is also disclosed, which includes a substrate comprising a first surface, a second surface opposite to the first surface, and a plurality of the first sidewalls adjacent to the first surface; a semiconductor epitaxial stack layer formed on the first surface, comprising a first semiconductor material layer with a first electrical conductivity, a second semiconductor material layer with a second electrical conductivity, an active layer positioned between the first semiconductor material layer and the second semiconductor material layer, and a third surface facing the first surface and a plurality of the second sidewalls adjacent to the third surface; and a protecting layer covering the second surface, the first sidewalls, and the second sidewalls.

BRIEF DESCRIPTION OF THE DRAWINGS

FIG. 3G illustrates a top view of a substrate of the semiconductor device structure in accordance with the embodiment of the disclosure;

FIG. 3H illustrates a top view of a substrate of the semiconductor device structure in accordance with the embodiment of the disclosure;

DETAILED DESCRIPTION OF PREFERRED EMBODIMENTS

Figure 1:
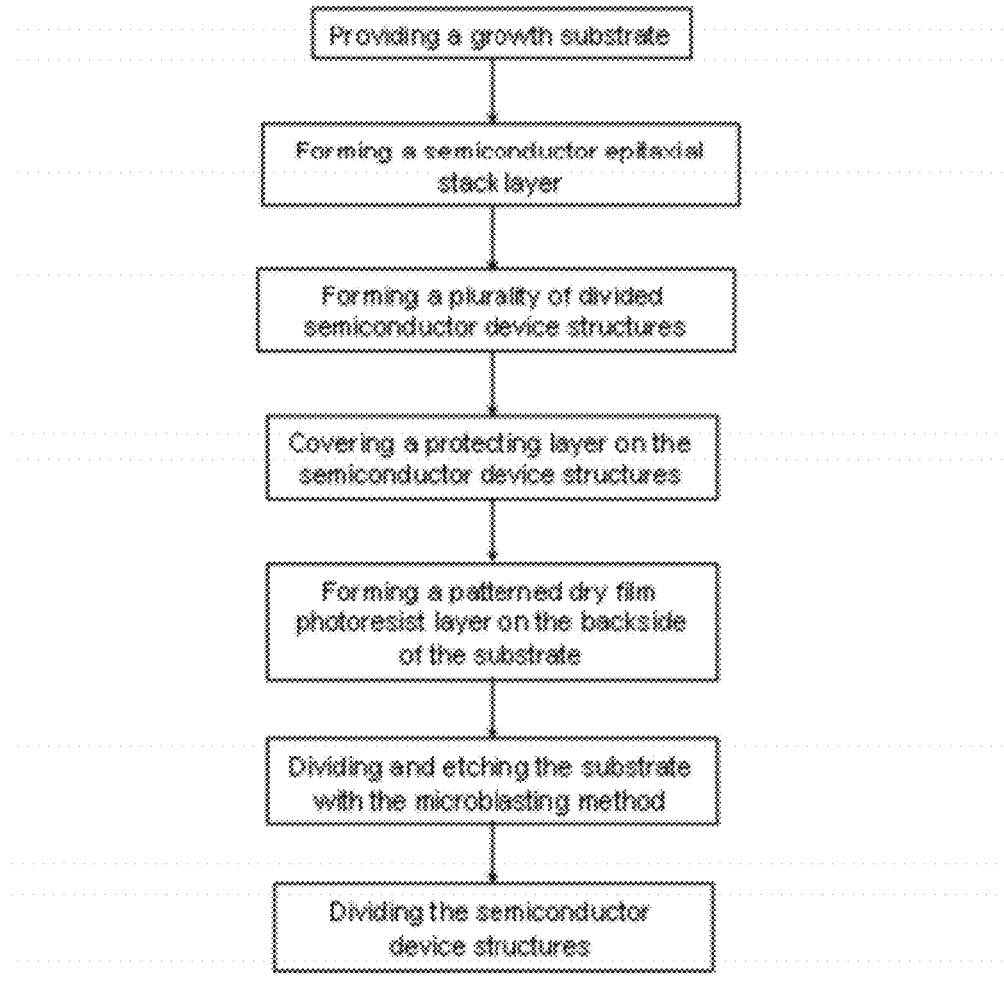
FIG. 1 illustrates a flow chart of separating the semiconductor device structures in accordance with an embodiment of the disclosure.

Referring to FIG. 1, a flow chart of separating the semiconductor device structures such as the light emitting diode devices is disclosed in accordance with the first embodiment in the disclosure. FIGS. 2A to 2G illustrate the structures of each step in the flow chart.

Figure 2A:
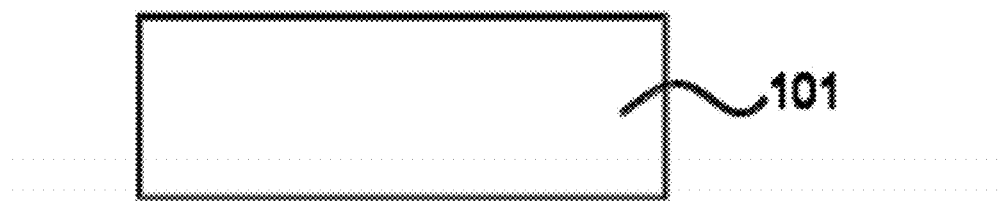
FIG. 2A illustrates a structure of the first step of separating the semiconductor device structures in accordance with an embodiment of the disclosure.
Figure 2B:
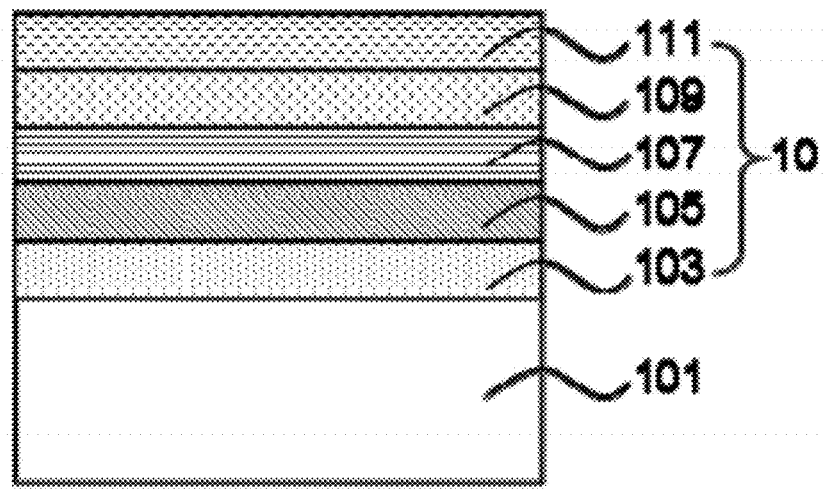
FIG. 2B illustrates a structure of the second step of separating the semiconductor device structures in accordance with the embodiment of the disclosure.
Figure 2C:
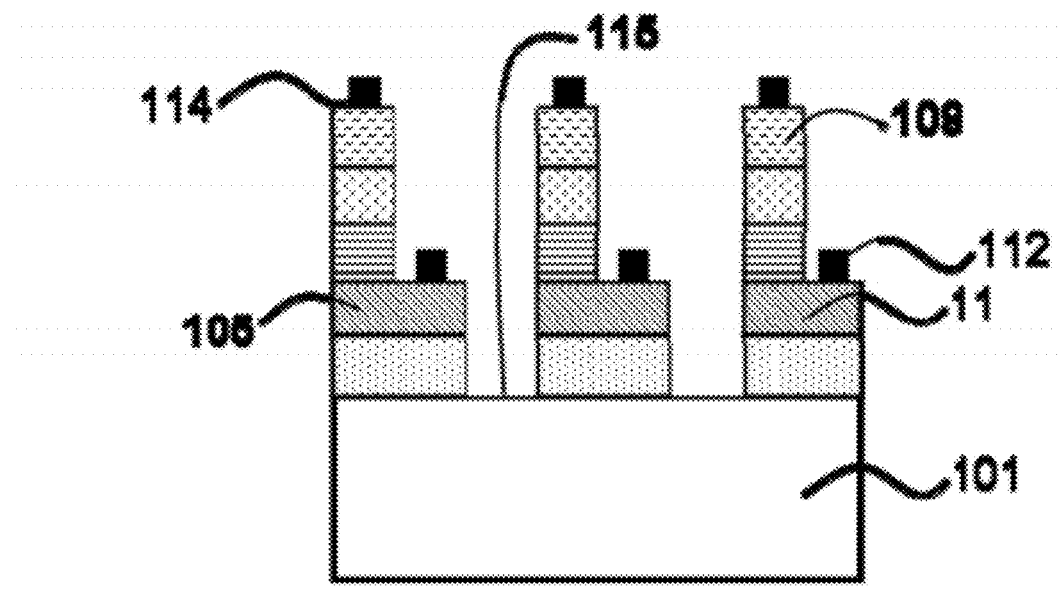
FIG. 2C illustrates a structure of the third step of separating the semiconductor device structures in accordance with the embodiment of the disclosure.
Figure 2D:
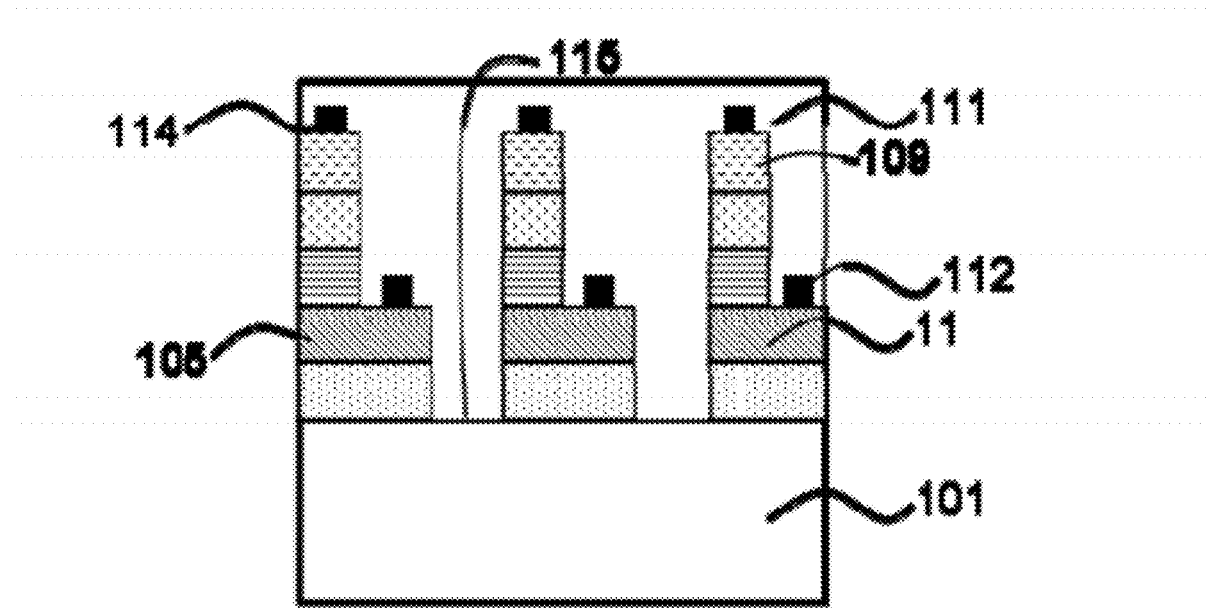
FIG. 2D illustrates a structure of the fourth step of separating the semiconductor device structures in accordance with the embodiment of the disclosure.
Figure 2E:
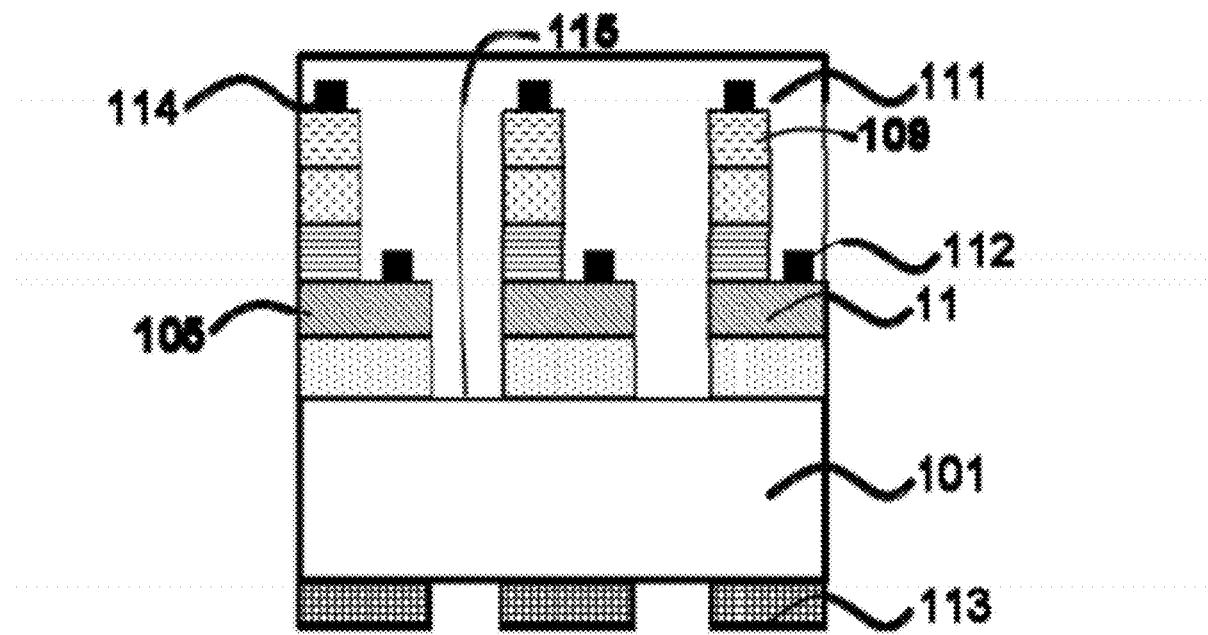
FIG. 2E illustrates a structure of the fifth step of separating the semiconductor device structures in accordance with the embodiment of the disclosure.
Figure 2F:
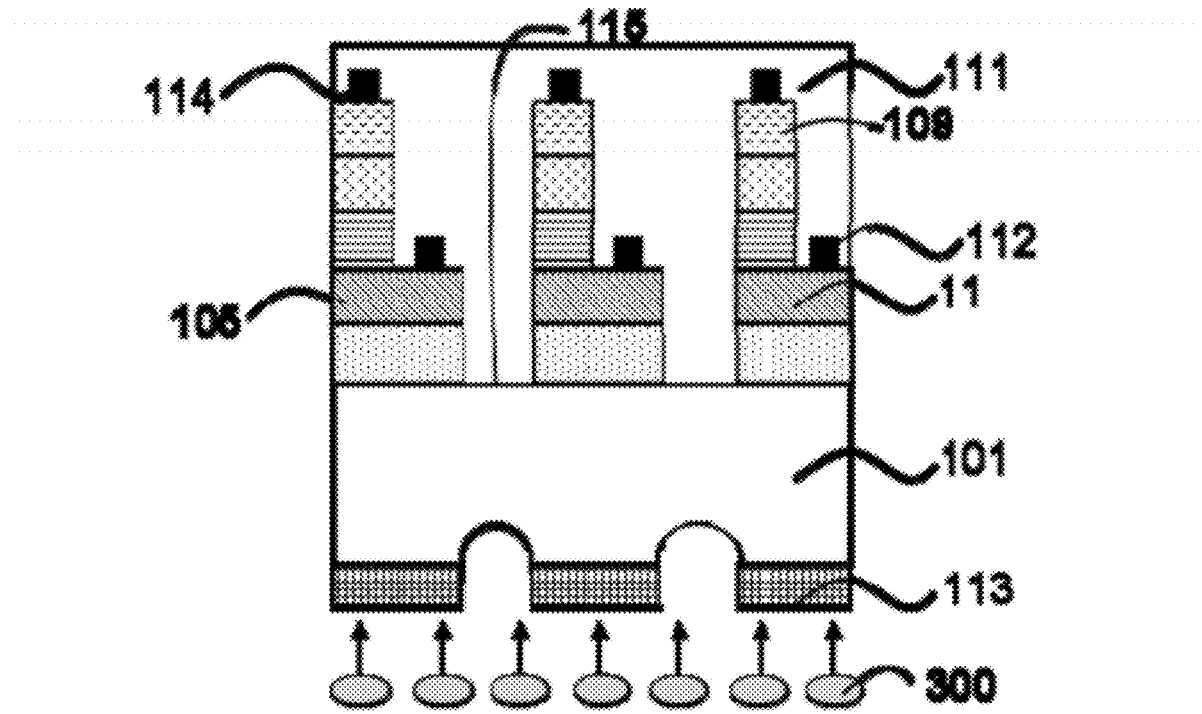
FIG. 2F illustrates a structure of the sixth step of separating the semiconductor device structures in accordance with the embodiment of the disclosure.
Figure 2G:
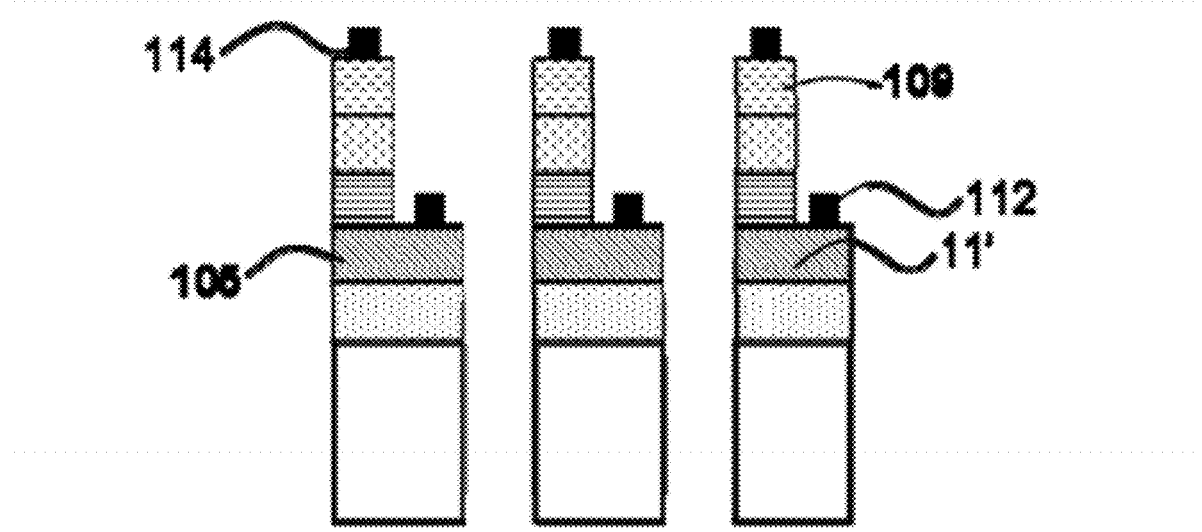
FIG. 2G illustrates a structure of the seventh step of separating the semiconductor device structures in accordance with the embodiment of the disclosure.
Figure 3A:
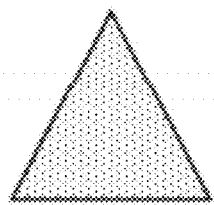
FIG. 3A illustrates a top view of a substrate of the semiconductor device structure in accordance with the embodiment of the disclosure.
Figure 3B:
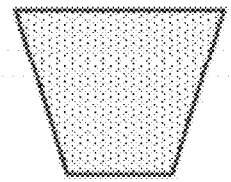
FIG. 3B illustrates a top view of a substrate of the semiconductor device structure in accordance with the embodiment of the disclosure.
Figure 3C:
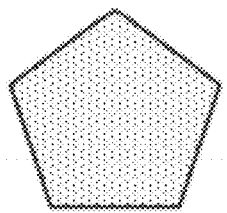
FIG. 3C illustrates a top view of a substrate of the semiconductor device structure in accordance with the embodiment of the disclosure.
Figure 3D:
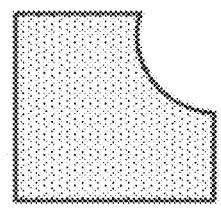
FIG. 3D illustrates a top view of a substrate of the semiconductor device structure in accordance with the embodiment of the disclosure.
Figure 3E:
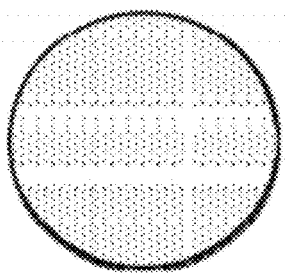
FIG. 3E illustrates a top view of a substrate of the semiconductor device structure in accordance with the embodiment of the disclosure.
Figure 3F:
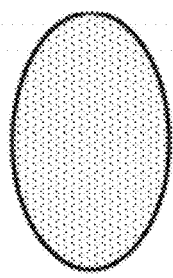
FIG. 3F illustrates a top view of a substrate of the semiconductor device structure in accordance with the embodiment of the disclosure.

Referring to FIG. 2A, the first step is to provide a substrate 101. For example, the substrate 101 could be a GaAs substrate in the present embodiment. The material of the substrate 101 could also be but not limited to SiC, AlGaAs, GaAsP, ZnSe, group III nitride (such as GaN), Sapphire, Si, spinel, ZnO, or glass. Then, as shown in FIG. 2B, forming a semiconductor epitaxial stack layer 10 on the substrate 101 by epitaxial growth or by bonding method. Take the light emitting diode devices as shown in the embodiment for example, the semiconductor epitaxial stack layer 10 includes a buffer layer 103, an n-type semiconductor material layer 105, a light-emitting layer 107, a p-type semiconductor material layer 109, a window layer 111, wherein the n-type semiconductor material layer 105 and the p-type semiconductor material layer 109 could be but not limited to made of AlGaInP series material or the group III nitride series material. The structure of the light-emitting layer 107 could be but not limited to a single heterostructure (SH), a double heterostructure (DH), a double-side double heterostructure (DDH), a single quantum well (SQW), or a multi quantum well (MQW) structure. The window layer 111 could be made of GaP. Besides, in order to enhance the current spreading efficiency, a transparent conductive layer (not shown) could also be optionally formed on the semiconductor epitaxial stack layer 10, and the transparent conductive layer could be made of ITO, IZO, ZnO, CTO, $In_2O_3$, $SnO_2$, MgO, CdO, or other transparent conductive oxide material. The semiconductor epitaxial stack layer 10 could be formed on the substrate 101 by the method such as metal-organic chemical vapor deposition (MOCVD), molecular beam epitaxy (MBE), liquid phase epitaxy (LPE), vapour phase epitaxy (VPE), direct bonding, bonding with connecting layer(s), eutectic bonding, and other conventional techniques. The connecting layer is omitted and not shown in the figures. Then, as shown in FIG. 2C, by the conventional photolithography and etching technology, the semiconductor epitaxial stack layer 10 is divided into a plurality of divided semiconductor epitaxial stacks 11, the n electrodes 112 are formed on the n-type semiconductor material layers 105, and the p electrodes 114 are formed on the p-type semiconductor material layers 109. Then, as shown in FIG. 2D, a protecting layer 111 covering the surfaces of the plurality of the divided semiconductor epitaxial stacks 11 is formed in order to protect the divided semiconductor epitaxial stacks from being damaged by the following manufacturing processes. Wherein, the structure of the protecting layer 111 could be a photoresist layer and could be removed by certain weak basic solution in the following step. Then, as shown in FIG. 2E, forming a patterned dry film photoresist 113 on the backside surface of the substrate 101. In order to protect part of the backside surface of the substrate 101 from being damaged by the microblasting method, the dry film photoresist 113 is preferred to be the resin composite with higher resilience. The dry film photoresist 113 is formed on part of the backside of the substrate 101 and exposes part of the backside surface corresponding to the space 115 between the divided semiconductor epitaxial stacks 11. Then, as shown in FIG. 2F, by taking advantage of the dry film photoresist 113 to be the protecting layer, bombarding the backside surface of the substrate 101 by the microblasting method. Because the hardness of the microblasting particles 300 is larger than the hardness of the substrate 101, the part the backside surface of the substrate 101 not covered by the dry film photoresist 113 is eroded by the microblasting method, which is a physical etching method, and the crack and the depression are formed accordingly. Wherein, by selecting the sizes and the materials of the microblasting particles 300, the ratio the etching rate the microblasting particles 300 etching the substrate over the etching rate the microblasting particles 300 etching the patterned photoresist could be larger than 10. Finally, after the backside surface of the substrate 101 is etched by the microblasting particles 300 over a period of time, the substrate 101 is punched through. By removing the protecting layer 111 and the dry film photoresist 113, the semiconductor epitaxial stacks 11 are divided into a plurality of semiconductor device structures 11', as shown in FIG. 2G.

Noticeably, the shapes of the semiconductor device structures (the top view of the substrates and/or the semiconductor epitaxial stacks) formed in the embodiment, considering the light extraction efficiency, are not limited to the conventional squares or rectangles. By the patterned photoresist and the microblasting technology, the shapes of the semiconductor device structures (the top view of the substrates and/or the semiconductor epitaxial stacks) could be triangles, irregular quadrangles, polygons with more than five sides, circles, ellipses, or other shapes with part of curved boundaries, as shown in FIGS. 3A to 3H. The person with ordinary skills in the art could realize the shapes of the structures are not limited to what mentioned above.

Figure 4:
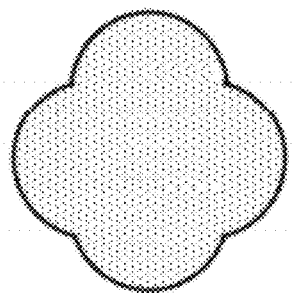
FIG. 4 illustrates a flow chart of separating the semiconductor device structures in accordance with another embodiment of the disclosure.
Figure 4:
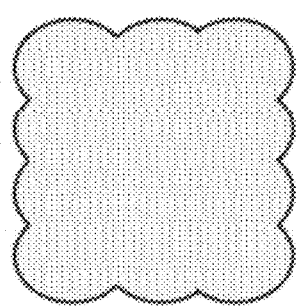
Figure 4:
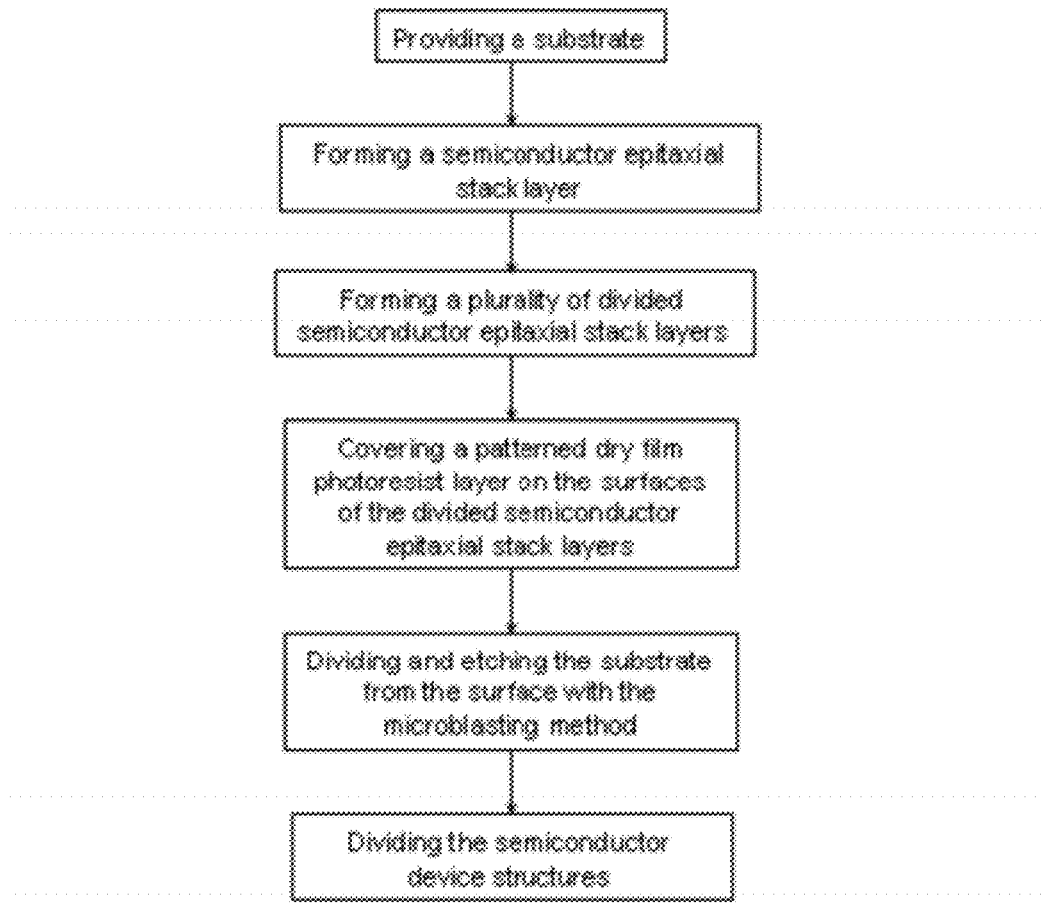

FIG. 4 shows another flow chart of separating the semiconductor device structures such as the light emitting diode devices is disclosed in accordance with the second embodiment in the disclosure. FIGS. 5A to 5G illustrate the structures of each step in the flow chart.

Figure 5A:
FIG. 5A illustrates a structure of the first step of separating the semiconductor device structures in accordance with another embodiment of the disclosure.
Figure 5B:
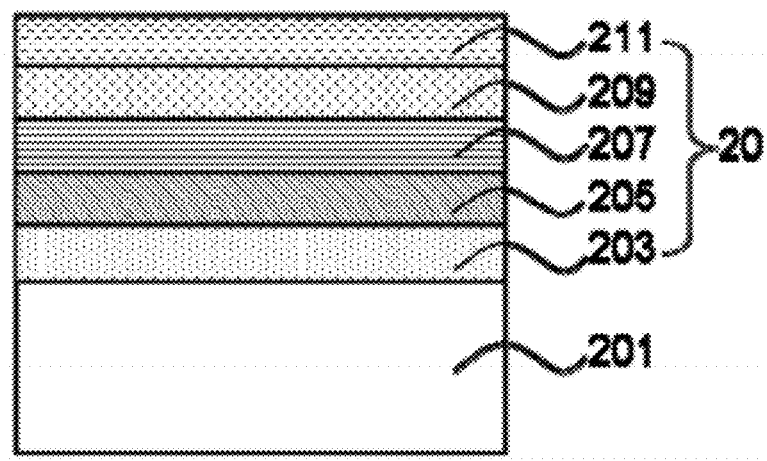
FIG. 5B illustrates a structure of the second step of separating the semiconductor device structures in accordance with the embodiment of the disclosure.
Figure 5C:
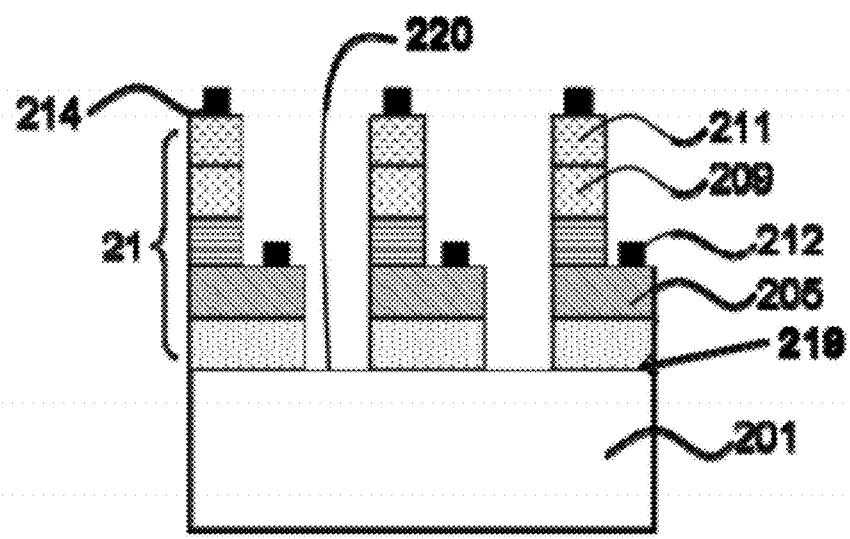
FIG. 5C illustrates a structure of the third step of separating the semiconductor device structures in accordance with the embodiment of the disclosure.
Figure 5D:
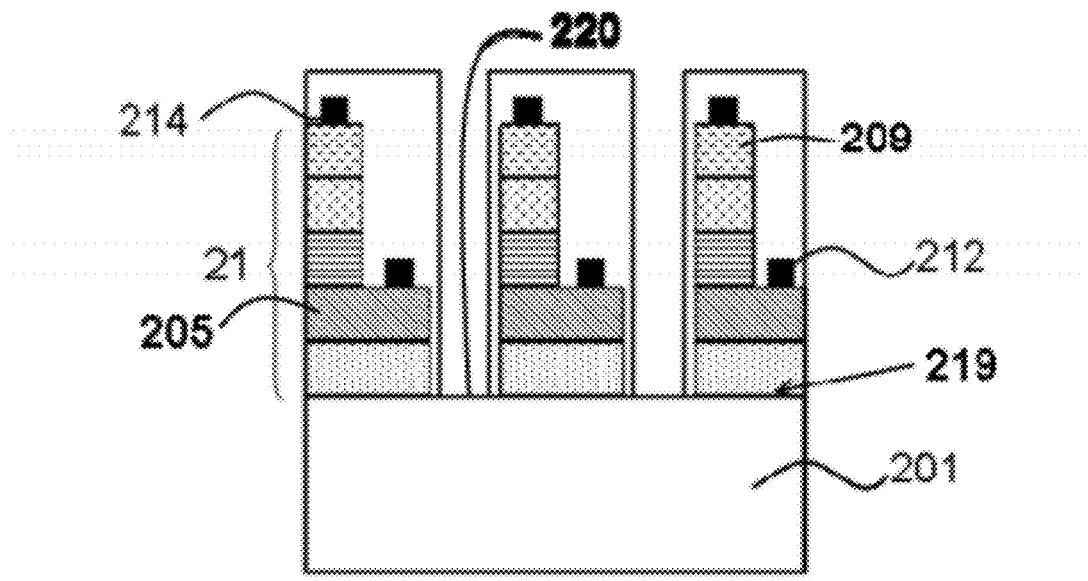
FIG. 5D illustrates a structure of the fourth step of separating the semiconductor device structures in accordance with the embodiment of the disclosure.
Figure 5E:
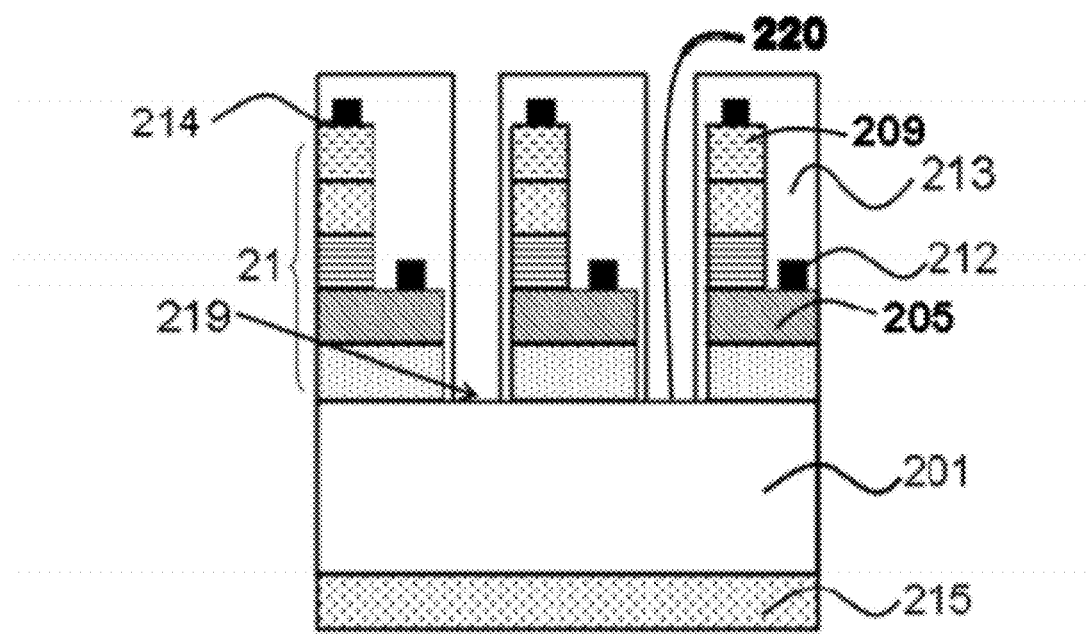
FIG. 5E illustrates a structure of the fifth step of separating the semiconductor device structures in accordance with the embodiment of the disclosure.
Figure 5F:
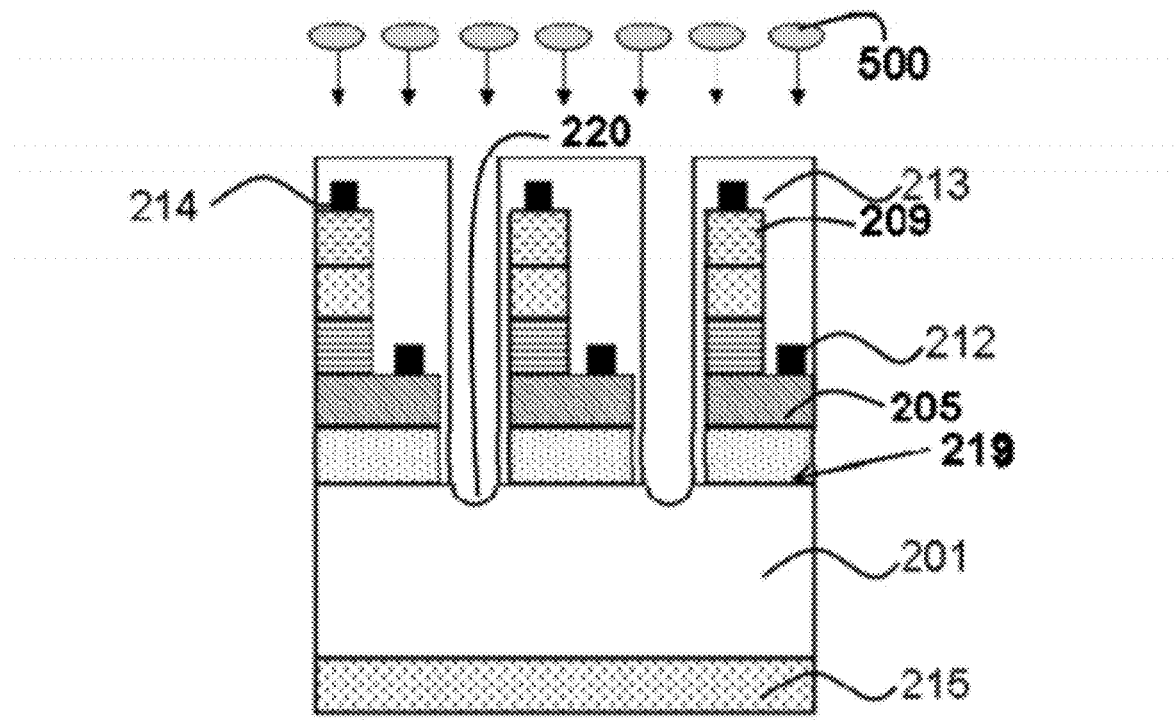
FIG. 5F illustrates a structure of the sixth step of separating the semiconductor device structures in accordance with the embodiment of the disclosure.
Figure 5G:
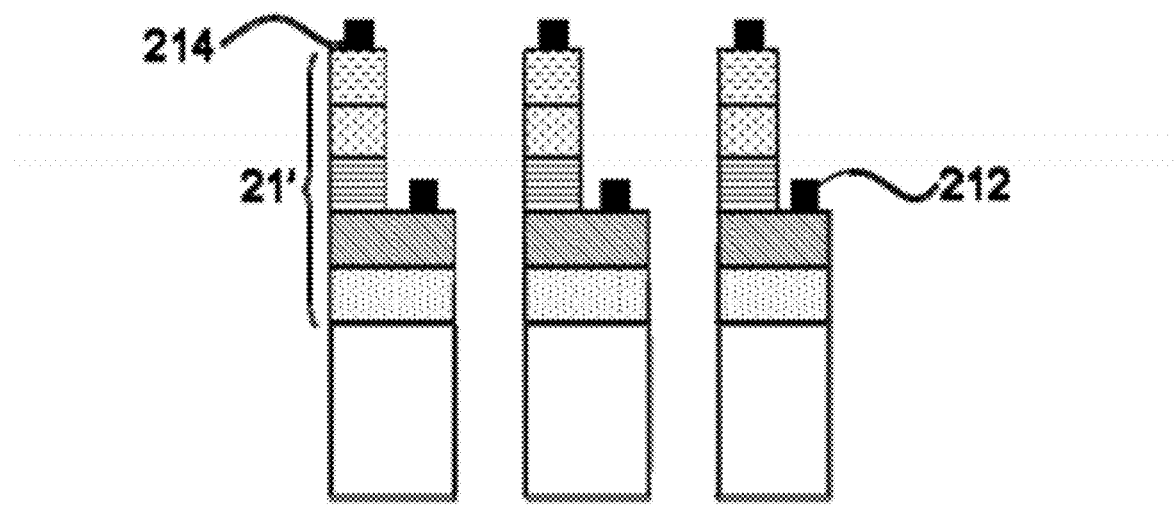
FIG. 5G illustrates a structure of the seventh step of separating the semiconductor device structures in accordance with the embodiment of the disclosure.

Referring to FIG. 5A, the first step is to provide a substrate 201. For example, the substrate 201 could be a GaAs substrate in the present embodiment. The material of the substrate 201 could also be but not limited to SiC, AlGaAs, GaAsP, ZnSe, group III nitride (such as GaN), Sapphire, Si, spinel, ZnO, or glass. Then, as shown in FIG. 5B, forming a semiconductor epitaxial stack layer 20 on the first surface 219 of the substrate 201 by epitaxial growth or by bonding method. Take the light emitting diode devices as shown in the embodiment for example, the semiconductor epitaxial stack layer 20 includes a buffer layer 203, an n-type semiconductor material layer 205, a light-emitting layer 207, a p-type semiconductor material layer 209, a window layer 211, wherein the n-type semiconductor material layer 205 and the p-type semiconductor material layer 209 could be but not limited to made of the AlGaInP series material or the group III nitride series material. The structure of the light-emitting layer 207 could be but not limited to a single heterostructure (SH), a double heterostructure (DH), a double-side double heterostructure (DDH), a single quantum well (SQW), or a multi quantum well (MQW) structure. The window layer 211 could be made of GaP. Besides, in order to enhance the current spreading efficiency, a transparent conductive layer (not shown) could also be optionally formed on the semiconductor epitaxial stack layer 20 and the transparent conductive layer could be made of ITO, IZO, ZnO, CTO, $In_2O_3$, $SnO_2$, MgO, CdO, or other transparent conductive oxide material. The semiconductor epitaxial stack layer 20 could be formed on the first surface of the substrate 201 by the method such as metal-organic chemical vapor deposition (MOCVD), molecular beam epitaxy (MBE), liquid phase epitaxy (LPE), vapour phase epitaxy (VPE), direct bonding, bonding with connecting layer(s), eutectic bonding, and other conventional techniques. The connecting layer is omitted and not shown in the figures. Then, as shown in FIG. 5C, by the conventional photolithography and etching technology, the semiconductor epitaxial stack layer 20 is divided into a plurality of divided semiconductor epitaxial stacks 21, the n electrodes 212 are formed on the n-type semiconductor material layers 205, and the p electrodes 214 are formed on the p-type semiconductor material layers 209 or the window layers 211 respectively. Then, as shown in FIG. 5D, a patterned dry film photoresist 213 covering the surfaces of the divided semiconductor epitaxial stacks 21 is formed to be a protecting layer, and the materials could be resin composite and so on. Meanwhile, part of the first surfaces 219 where no semiconductor epitaxial stacks 21 located is exposed. Then, as shown in FIG. 5E, a supporting layer 215 is formed on the backside surface of the substrate 201 for supporting and holding the whole structure after the substrate 201 is separated. The material of the supporting layer 215 could be the UV adhesive tape, the acrylic tape, the acid-base resist tape, the heat resist tape, or the ordinary blue tape and so on. Then, as shown in FIG. 5F, bombarding the first surface of the substrate 201 by the microblasting method. Because the hardness of the microblasting particles 500 is larger than the hardness of the substrate 201, the part the first surface 219 of the substrate 201 not covered by the dry film photoresist 213 is eroded by the microblasting method, which is a physical etching method, and the crack and the depression are formed accordingly. Wherein, by selecting the sizes and the materials of the microblasting particles 500, the ratio the etching rate the microblasting particles 500 etching the substrate 201 over the etching rate the microblasting particles 500 etching the patterned photoresist 213 could be larger than 10. Finally, after the first surface 219 of the substrate 201 is etched by the microblasting particles 500 over a period of time, the part the substrate 201 not covered by the dry film photoresist 213 is punched through and the semiconductor epitaxial stack layer 21 is separated into a plurality of divided semiconductor epitaxial structures 21' which are adhered on the supporting layer 215. By removing the supporting layer 215 and the dry film photoresist 213, a plurality of semiconductor device structures 21' are formed as shown in FIG. 5G.

Similarity, the shapes of the semiconductor device structures (the top view of the substrates and/or the semiconductor epitaxial stacks) formed in the embodiment, considering the light extraction efficiency, are not limited to the conventional squares or rectangles. By the patterned photoresist and the microblasting technology, the shapes of the semiconductor device structures (the top view of the substrates and/or the semiconductor epitaxial stacks) could be triangles, irregular quadrangles, polygons with more than five sides, circles, ellipses, or other shapes with part of curved boundaries, as shown in FIGS. 3A to 3H. The person with ordinary skills in the art could realize the shapes of the structures are not limited to what mentioned above.

Figures 6A, 6B:
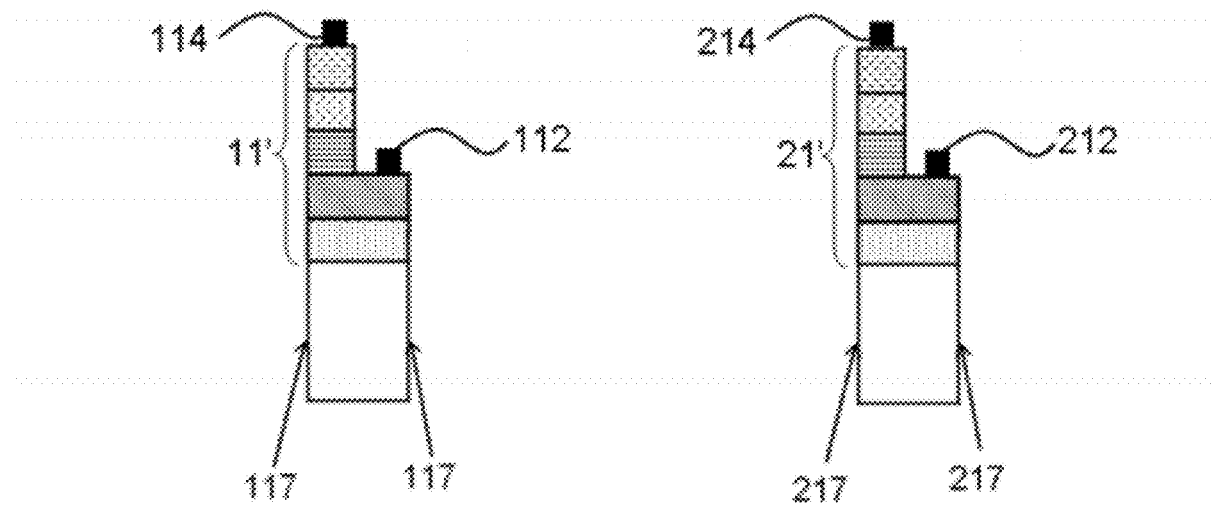
FIG. 6A illustrates a side view of the semiconductor device structure in accordance with an embodiment of the disclosure.
FIG. 6B illustrates a side view of the semiconductor device structure in accordance with the embodiment of the disclosure.
Figures 7A, 7B:
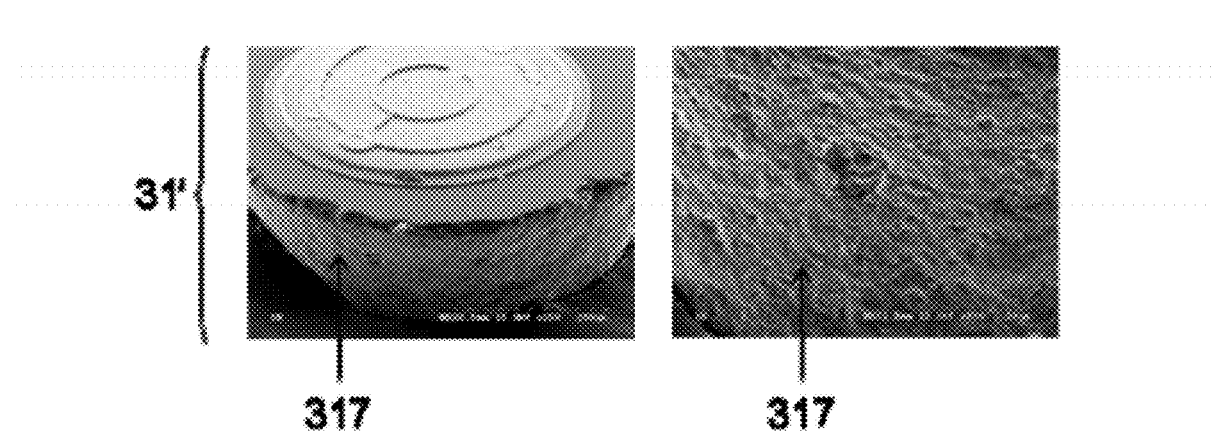
FIG. 7A illustrates a structure of the semiconductor device structure in accordance with the embodiment of the disclosure.
FIG. 7B illustrates an enlarged side view of the semiconductor device structure as shown in FIG. 7A.

Besides, as shown in FIGS. 6A and 6B, because the microblasting process is a kind of physical etching method, most of the sidewalls 117 and 217 of the substrate of the semiconductor device structures 11' and 21' are rough because of the bombardment of the microblasting particles. The surface roughness ranges from 1 micrometer to 40 micrometers in accordance with the different radius of the microblasting particles. Because of the rough surfaces on the substrate, a larger portion of the light emitted from the semiconductor device structures 11' and 21' could be extracted to outside through different extraction angles of the substrate so a higher light extraction efficiency could be achieved. As shown in FIG. 7A, the surface roughness formed by the bombardment of the microblasting particles of the sidewall 317 of the semiconductor device structure 31' is disclosed. FIG. 7B is the local enlarged view of the sidewall 317 of the substrate 31'.

Figure 8:
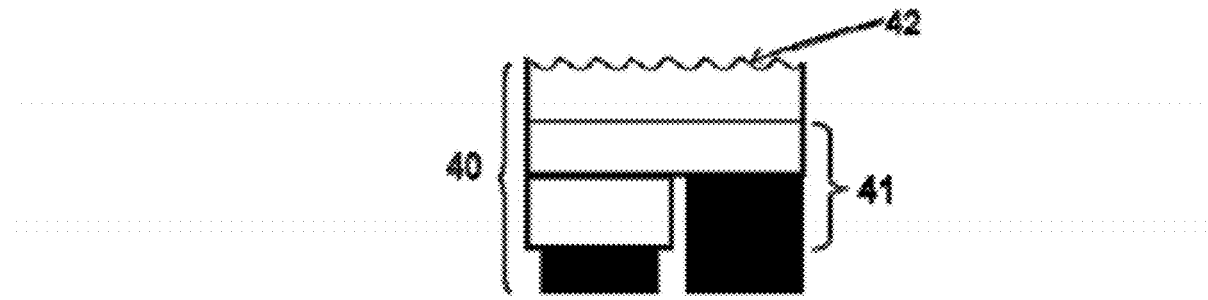
FIG. 8 illustrates a structure of the flip-chip semiconductor device structure in accordance with another embodiment of the disclosure.

Furthermore, the separation methods of the semiconductor device structures in the present disclosure are also applicable to the flip-chip light emitting diode devices 40 as illustrated in FIG. 8. Because the light emitting surface of the flip-chip light emitting diode device 40 is opposite to the surface where the semiconductor epitaxial stacks 41 is formed on, in order to enhance the light extraction efficiency of the flip-chip light emitting devices 40, the roughening process could be applied to the light emitting surface 42 of the substrate which is opposite to the surface where the semiconductor epitaxial stacks 41 is formed on as shown in FIG. 8.

Figure 9A:
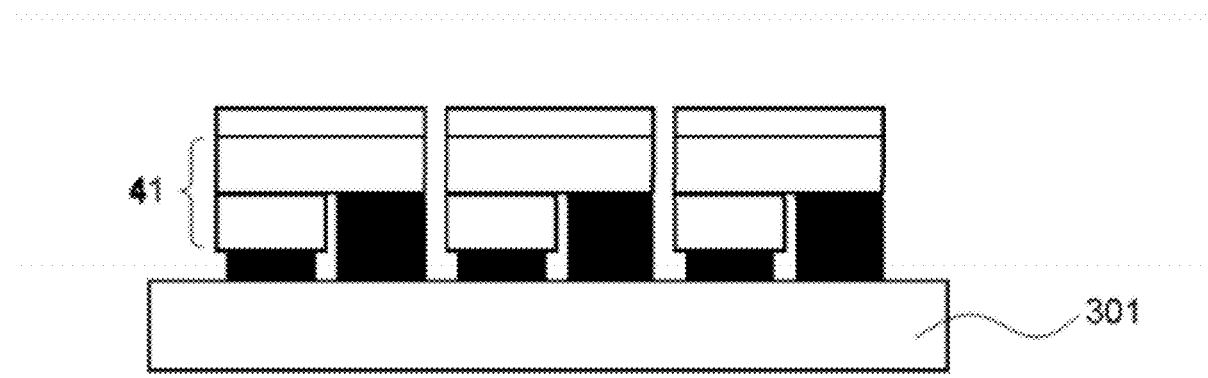
FIG. 9A illustrates a structure of the first step of separating the package type semiconductor device structures in accordance with another embodiment of the disclosure.
Figure 9B:
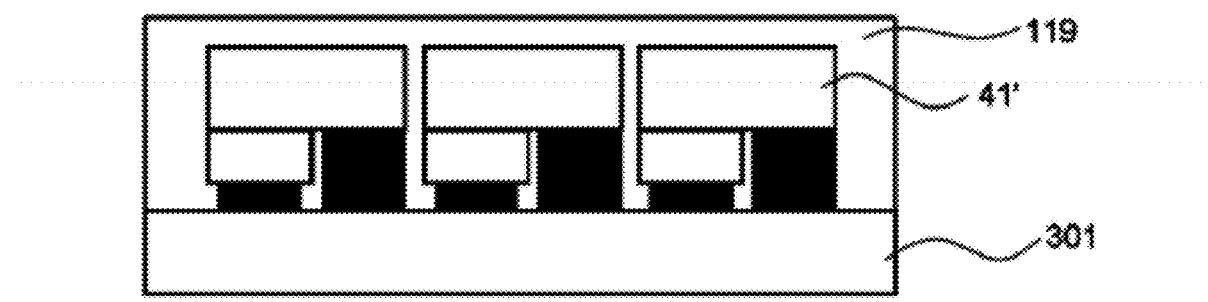
FIG. 9B illustrates a structure of the second step of separating the package type semiconductor device structures in accordance with the embodiment of the disclosure.
Figure 9C:
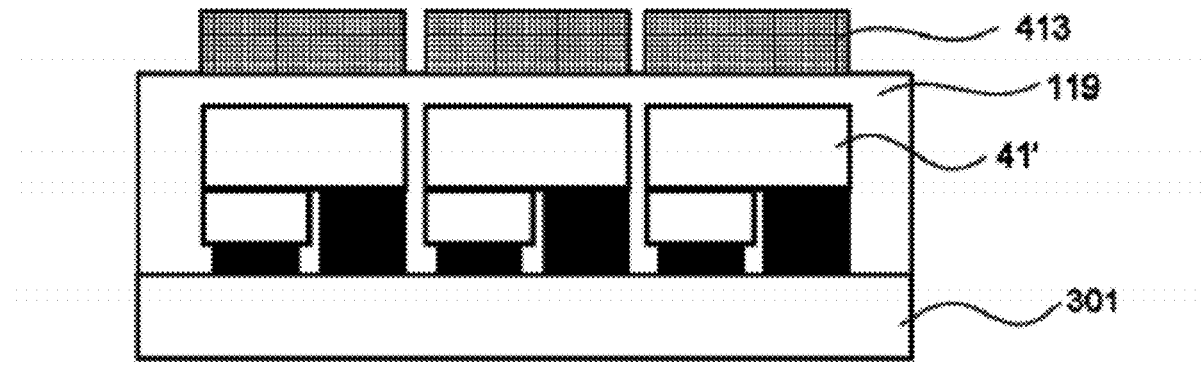
FIG. 9C illustrates a structure of the third step of separating the package type semiconductor device structures in accordance with the embodiment of the disclosure.
Figure 9D:
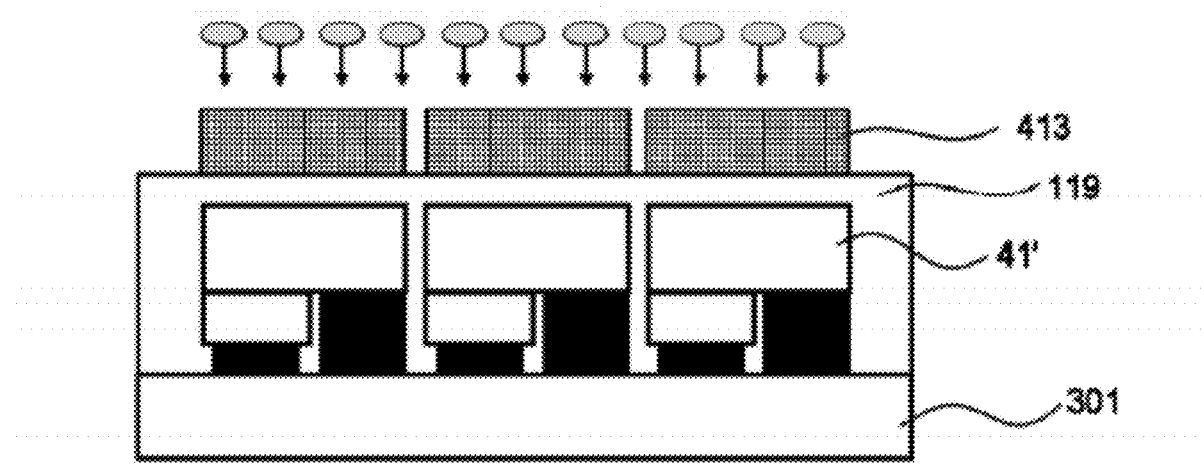
FIG. 9D illustrates a structure of the fourth step of separating the package type semiconductor device structures in accordance with the embodiment of the disclosure.
Figure 9E:
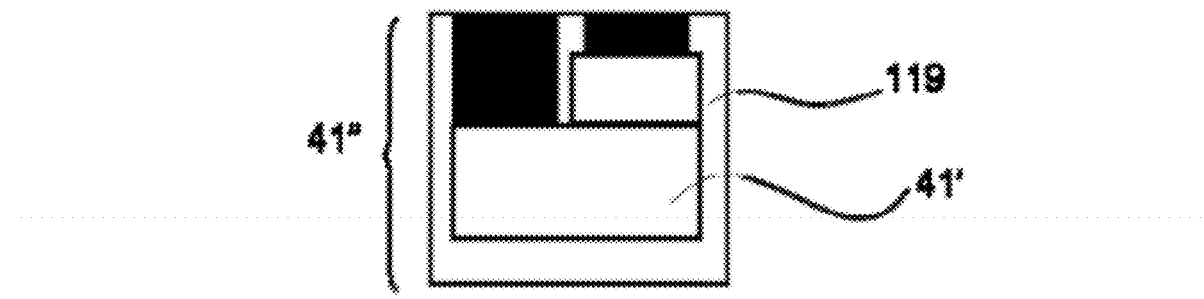
FIG. 9E illustrates a structure of the fifth step of separating the package type semiconductor device structures in accordance with the embodiment of the disclosure.

Besides, in order to enhance the protection for the devices, after the semiconductor device structures 41' are formed, the divided semiconductor device structures are adhered to a temporary substrate 301 by a flip-chip method. The material of the temporary substrate could be silicone resin as shown in FIG. 9A. Then, as shown in FIG. 9B, covering all the substrate surfaces and sidewalls of the semiconductor device structures 41 with the liquid silicone resin 119 by the spin coating method, and curing the silicone resin 119 by heating. Then, as shown in FIG. 9C, forming the patterned dry film photoresist 413 on the backside surfaces of the temporary substrate or the surfaces of the silicone resin 119 corresponding to where the semiconductor device structures located. Finally, the cured thermosetting resin is divided by the microblasting method to separate the semiconductor device structures again. As shown in FIG. 9D, when the final structures removed from the temporary substrate, the structure could be the same as the package type semiconductor device structure 41'' which is protected by the surrounding resin shown in FIG. 9E.

The embodiments mentioned above are used to describe the technical thinking and the characteristic of the invention and to make the person with ordinary skill in the art to realize the content of the invention and to practice, which could not be used to limit the claim scope of the present application. Any modification or variation according to the spirit of the present application should also be covered in the claim scope of the present disclosure.

What is claimed is:

1. A method of separating semiconductor device structures, comprising:
    providing a substrate, comprising a first surface and a second surface opposite to the first surface;
        forming a plurality of semiconductor epitaxial stacks on the first surface;
        forming a patterned resist layer covering the semiconductor epitaxial stacks and exposing part of the first surface, or covering the second surface corresponding to the semiconductor epitaxial stacks;
        performing a physical etching process to directly sever the substrate apart from an area of the first surface or the second surface not covered by the patterned resist layer, wherein the physical etching process is a microblasting process; and
    separating the semiconductor epitaxial stacks to form a plurality of semiconductor device structures.

2. The method of separating a semiconductor device structure as claimed in claim 1, further comprising the step of removing the patterned resist layer after etching the substrate by the physical etching process.

3. The method of separating a semiconductor device structure as claimed in claim 1, further comprising the step of forming a protective layer covering the semiconductor epitaxial stacks.

4. The method of separating a semiconductor device structure as claimed in claim 1, wherein the ratio of the etching rate of the etchant etching the substrate over the etching rate of the etchant etching the patterned resist layer is larger than 10.

5. The method of separating a semiconductor device structure as claimed in claim 1, wherein some of the sidewalls of the substrates of the semiconductor device structures are curved.

6. The method of separating a semiconductor device structure as claimed in claim 1, wherein the substrates of the semiconductor device structures are triangles, irregular quadrangles, and/or polygons with more than five sides.

7. The method of separating a semiconductor device structure as claimed in claim 1, further comprising forming a supporting layer on the second surface.

8. A package type semiconductor device structure, comprising:
    a substrate comprising a first surface, a second surface opposite to the first surface, and a plurality of the first sidewalls adjacent to the first surface;
    a semiconductor epitaxial stack formed on the first surface, comprising:
        a first semiconductor material layer with a first electrical conductivity;
        a second semiconductor material layer with a second electrical conductivity;
        an active layer positioned between the first semiconductor material layer and the second semiconductor material layer; and
        a third surface facing the first surface and a plurality of second sidewalls adjacent to the third surface;
        a fourth surface opposite to the third surface and having at least an electrode thereon; and
    a protecting layer, covering the second surface, the first sidewalls, and the second sidewalls, and exposing a surface of the electrode.

9. The package type semiconductor device structure as claimed in claim 8, further comprising a connecting layer positioned between the substrate and the semiconductor epitaxial stack.

10. The package type semiconductor device structure as claimed in claim 8, wherein the protecting layer comprises silicone.

11. The package type semiconductor device structure as claimed in claim 8, wherein the protecting layer covers all of the second surface, the first sidewalls, the second sidewalls, and the electrode excepting the exposed surface.

12. The package type semiconductor device structure as claimed in claim 8, wherein the electrode comprises a first electrode connected to the first semiconductor material layer and a second electrode connected to the second semiconductor material layer.

13. The package type semiconductor device structure as claimed in claim 8, wherein the second surface is a roughened surface.

14. The semiconductor device structure as claimed in claim 13, wherein the roughened surface has a roughness ranging from 1 micrometer and to 40 micrometers.

\* \* \* \* \*